US006463395B1

(12) United States Patent
Iorga

(10) Patent No.: US 6,463,395 B1
(45) Date of Patent: Oct. 8, 2002

(54) SHUNT CAPACITANCE COMPENSATION STRUCTURE AND METHOD FOR A SIGNAL CHANNEL

(75) Inventor: Cosmin Iorga, Northridge, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/457,883

(22) Filed: Dec. 10, 1999

(51) Int. Cl.[7] .................................................. G01R 3/00
(52) U.S. Cl. ........................................ 702/107; 702/105
(58) Field of Search ........................... 455/260; 372/38; 385/2; 359/157; 307/443, 572; 361/311; 324/664; 364/509; 332/16; 330/311; 702/107, 105

(56) References Cited

U.S. PATENT DOCUMENTS

| | | | | | |
|---|---|---|---|---|---|
| 4,564,818 | A | * | 1/1986 | Jones | 330/311 |
| 4,633,197 | A | * | 12/1986 | Vanderspool, II | 332/16 |
| 4,706,203 | A | * | 11/1987 | Ramsdale et al. | 364/509 |
| 4,924,172 | A | * | 5/1990 | Holmgren | 324/664 |
| 4,980,799 | A | * | 12/1990 | Tobita | 361/311 |
| 4,988,902 | A | * | 1/1991 | Dingwall | 307/572 |
| 5,017,807 | A | * | 5/1991 | Kriz et al. | 307/443 |
| 5,282,072 | A | * | 1/1994 | Nazarathy et al. | 359/157 |
| 5,339,369 | A | * | 8/1994 | Hopfer et al. | 385/2 |
| 5,471,492 | A | * | 11/1995 | Pidgeon, Jr. et al. | 372/38 |
| 5,499,392 | A | * | 3/1996 | Grunwell | 455/260 |

OTHER PUBLICATIONS

"Reed Relay Technical & Applications Information", Coto Technology, date unknown.
Product Description for "12–Bit Schottky Barrier Diode Bus Terminator", California Micro Devices, Jul. 26, 1999.
Coto Technology Product Selector Chart, Jul. 26, 1999.
Coto Technology 9400–9800 Series/Surface Mount Reed Relay Product Information, Jul. 26, 1999.
Coto Technology 9400–9800 Series/Surface Mount Reed Relay Product Information Sheet, Jul. 26, 1999.

* cited by examiner

*Primary Examiner*—Marc S. Hoff
*Assistant Examiner*—Felix Suarez
(74) *Attorney, Agent, or Firm*—Teradyne Legal Dept.

(57) ABSTRACT

A reed relay or other device is connected electrically in series within a signal channel. The signal channel can include a first length of transmission line separated from a second length of transmission line. Both lengths may be of the microstrip type and have a controlled characteristic impedance. A first signal lead of the device electrically connects the lengths of transmission line. A first branch of the first signal lead is connected to the first length of transmission line, and a second branch of the first signal lead is connected to the second length of transmission line. The signal leads are electrically connected to each other at a location adjacent an operative portion of the devices. The series inductance of the first signal lead substantially cancels the shunt capacitance of the reed to substantially maintain the characteristic impedance of the transmission line.

21 Claims, 7 Drawing Sheets

SHUNT CAPACITANCE COMPENSATION STRUCTURE AND METHOD FOR A SIGNAL CHANNEL

BACKGROUND OF THE INVENTION

Automatic test equipment plays a critical role in the manufacturing process for semiconductor devices. The equipment, often referred to as a "tester", simulates an operating environment for devices at the wafer and package levels. By verifying the operability of each semiconductor device under varying conditions, manufacturers can realize high yields and provide a correspondingly higher level of reliability to customers. Not surprisingly, this translates into higher revenues for the semiconductor manufacturer.

Testers employed by semiconductor manufacturers generally include a computer workstation that runs test software for controlling the test. The software controls signal parameters for test vectors or waveforms that drive the semiconductor device. A pattern generator typically produces the waveforms and routes the signals to electronic circuits commonly referred to as pin electronics.

The pin electronics generally reside on one or more channel cards that route signals between the tester and one or more pins of a device under test ("DUT"). The pin electronics perform several tester functions and generally serve as a signal interface between the pattern generator and the DUT. One of the more important functions is to drive waveforms along a transmission path, or signal channel, to the pins of the DUT. The signal channel utilizes conductive signal traces, or microstrip transmission lines, in driving the waveforms to the pins of the DUT.

Dramatic increases in the speed of microprocessors and memory devices require testers to operate at ever-increasing speeds. For example, modern computer RAM designs have operating speeds surpassing 800 MHz. These and many other modern semiconductor devices need to be tested for operation at high frequencies, and thus high frequency waveforms must be passed between the tester and the DUT with minimal distortion. In order to prevent distortion of high frequency waveforms, it is important for the transmission lines to have controlled characteristic impedances. One method of correcting for impedance mismatches along the transmission lines is described in pending U.S. patent application Ser. No. 09/309,134, filed on May 10, 1999, which is incorporated by reference in its entirety into the present specification.

Individual channels typically employ convenient alternate paths for calibration purposes. The alternate paths are switched-in by "fly-by" relays. Unfortunately, when in an open condition, such relays effectively form "stubs" hanging from the transmission lines, introducing a shunt capacitance which creates a mismatch in the impedance along the transmission line. One way of dealing with this problem is to trim the transmission lines leading to the relays to make the lines thinner and thus introduce a series inductance which compensates for the added shunt capacitance.

The approach of matching impedance by thinning the transmission lines has the disadvantage that the relays add a relatively large shunt capacitance which requires a relatively large compensating series inductance. These large shunt and series reactances cause the circuit to oscillate at a relatively low frequency, thus setting an upper limit on the frequency range over which the pin electronics can be used. Another disadvantage of thinning the transmission line is that it increases dielectric losses and ohmic conductor losses due to the "skin effect".

Thus, there is a need to compensate for the shunt capacitance added by devices along a transmission line without introducing low frequency resonances and without introducing unnecessary losses.

SUMMARY OF THE INVENTION

An apparatus and method for shunt capacitance compensation for a signal channel according to the present invention compensates for the shunt capacitance of devices forming stubs hanging from a transmission line, without introducing low frequency resonant frequencies and without introducing unnecessary losses.

To realize these advantages, at least two lengths of controlled impedance transmission line are typically separated by a "gap" or other effective discontinuity. A first signal lead of a device has two branches electrically couples the lengths of transmission line across the gap. One branch is connected to one of the lengths of transmission line, and the other branch is connected to the other length of transmission line, thereby forming a series connection with the lengths of transmission line. The two branches are connected together within or adjacent the device to minimize the effective length of the electrical "stub" represented by the device. This significantly reduces the shunt capacitance presented by the device itself. In addition, the two branches have series inductances which combine to substantially cancel a relatively small capacitance introduced by the device, thus substantially maintaining the characteristic impedance of the transmission line.

Thus, an apparatus and method for shunt capacitance compensation in a signal channel to which an electrical device is connected includes: a signal channel for transmitting signals to a destination; a device having a first signal lead forming first and second branches connected together at a location adjacent an operative portion of the device so that the first signal lead is electrically connected to the operative portion of the device, the branches being electrically coupled in series within the signal channel; and wherein the branches together have a combined series inductance which substantially cancels the shunt capacitance introduced by the device. In one embodiment, the signal channel includes first and second lengths of transmission line separated by a gap, the first branch being connected to the first length of transmission line and the second branch being connected to the second length of transmission line to electrically couple the branches in series within the signal channel. The first and second branches may be connected together at a location within the device, which may be a reed relay in which a reed is the operative portion of the device. In cases where the relay initially has a first ground lead, a second ground lead and a second signal lead, the first branch of the first signal lead is formed by disconnecting the first ground leed from the second ground leed and reattaching it to the first signal lead at a location adjacent the operative portion of the relay.

BRIEF DESCRIPTION OF THE DRAWINGS

In the drawings, which constitute part of this specification, embodiments demonstrating various features of the invention are set forth as follows.

DESCRIPTION OF THE PREFERRED EMBODIMENTS

Although detailed illustrative embodiments are disclosed herein, other suitable structures and machines for practicing the invention may be employed and will be apparent to persons of ordinary skill in the art. Consequently, specific structural and functional details disclosed herein are representative only; they merely describe exemplary embodiments of the invention.

Figure 1:
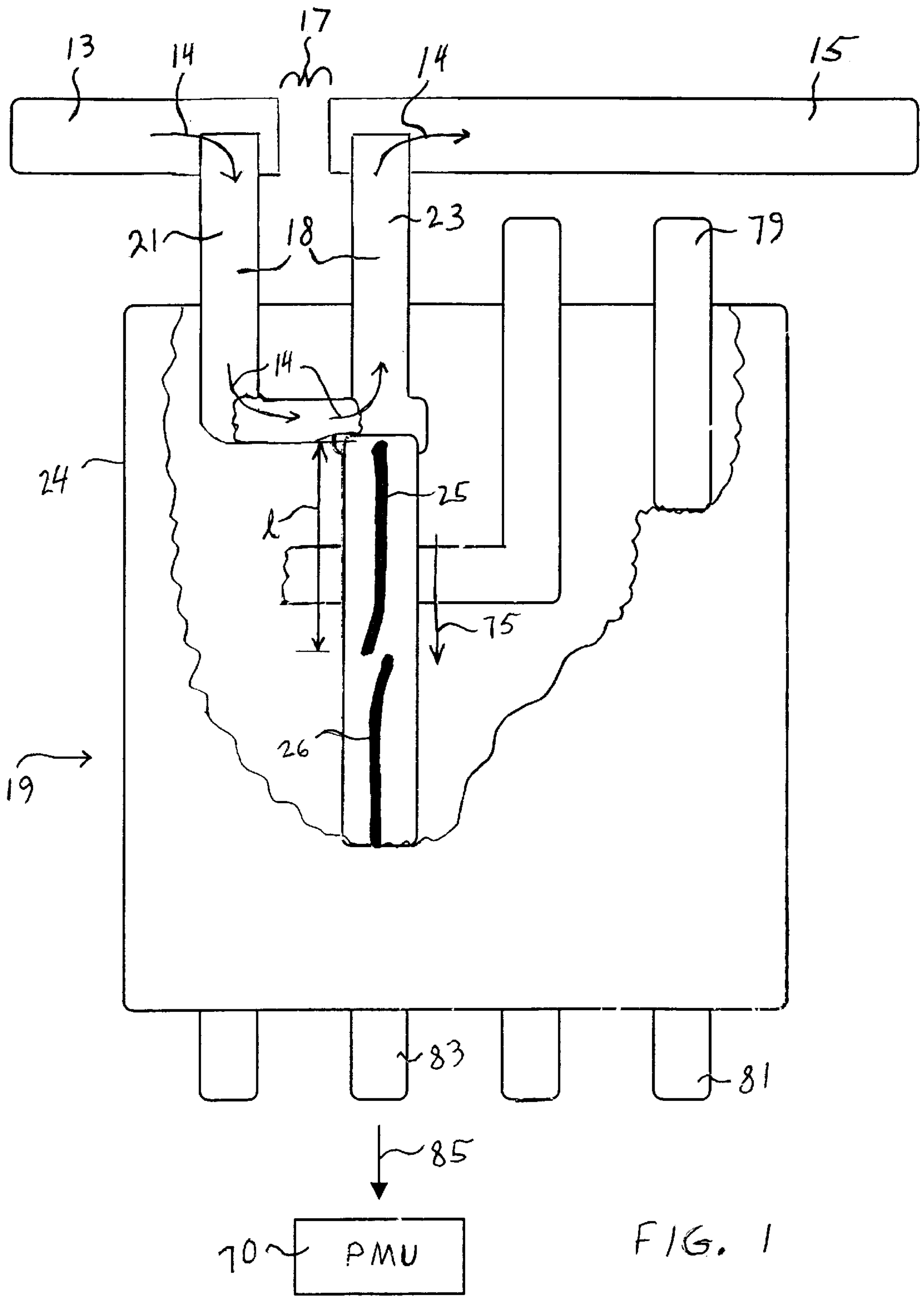
FIG. 1 is a somewhat diagrammatic top plan view, partially broken away, of an apparatus constructed according to the invention for shunt capacitance compensation in a signal channel.

FIG. 1 shows a first length of conductive signal trace or microstrip transmission line 13 separated from a second length of transmission line 15 by a gap 17. Both lengths of transmission line have a controlled characteristic impedance. The first and second lengths of transmission line 13, 15 form part of a signal channel through which electrical signals pass. A first signal lead 18 of reed relay 19 electrically connects the lengths of transmission line 13, 15 across the gap 17. A first branch 21 of the first signal lead 18 is connected to the first length of transmission line 13, and a second branch 23 of the first signal lead 18 is connected to the second length of transmission line 15. The branches 21, 23 are electrically connected to each other at a location directly adjacent an operative portion of the relay within a relay housing 24. Thus the branches 21, 23 are coupled in series within the signal channel. The branches 21, 23 do not require a physical connection with the signal channel to be coupled in series with the signal channel, but can, for example, be electromagnetically coupled to the signal channel. In the instant case, the operative portion includes a reed portion 25 of the relay 19. Referring now to the high level diagram depicted in FIG. 2, series inductances 27, 29 of the branches 21, 23 substantially cancel a shunt capacitance 31 of the reed portion 25 to substantially maintain the characteristic impedance of the lengths of transmission line 13, 15.

Figure 3:
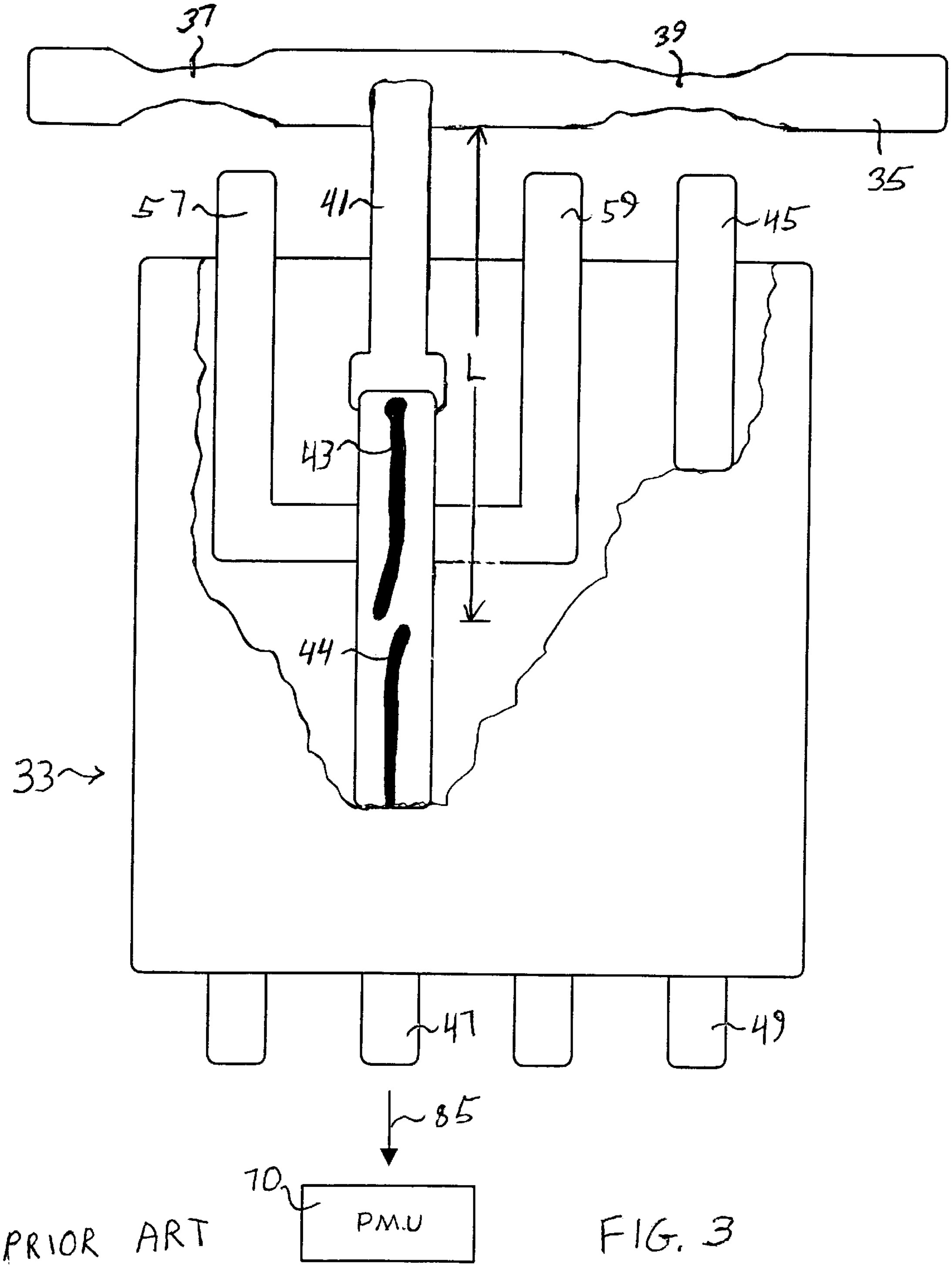
PRIOR ART FIG. 3
FIG. 3 is a view similar to FIG. 1 of a typical relay attached to a transmission line with trimmed traces in the manner of the prior art.

FIG. 3 illustrates a prior art structure for characteristic impedance compensation in a signal channel. A relay 33 is attached to a transmission line 35 by way of a first signal lead 41. Electrically connected to the signal lead 41, and located within the housing of the relay 33, is a reed portion 43 normally in an open position. A coil (not shown) is energized through coil leads 45, 49 to move the reed portion 43 to a closed position with a reed portion 44 to form an electrical connection between the first signal lead 41 and a second signal lead 47.

Figure 4:
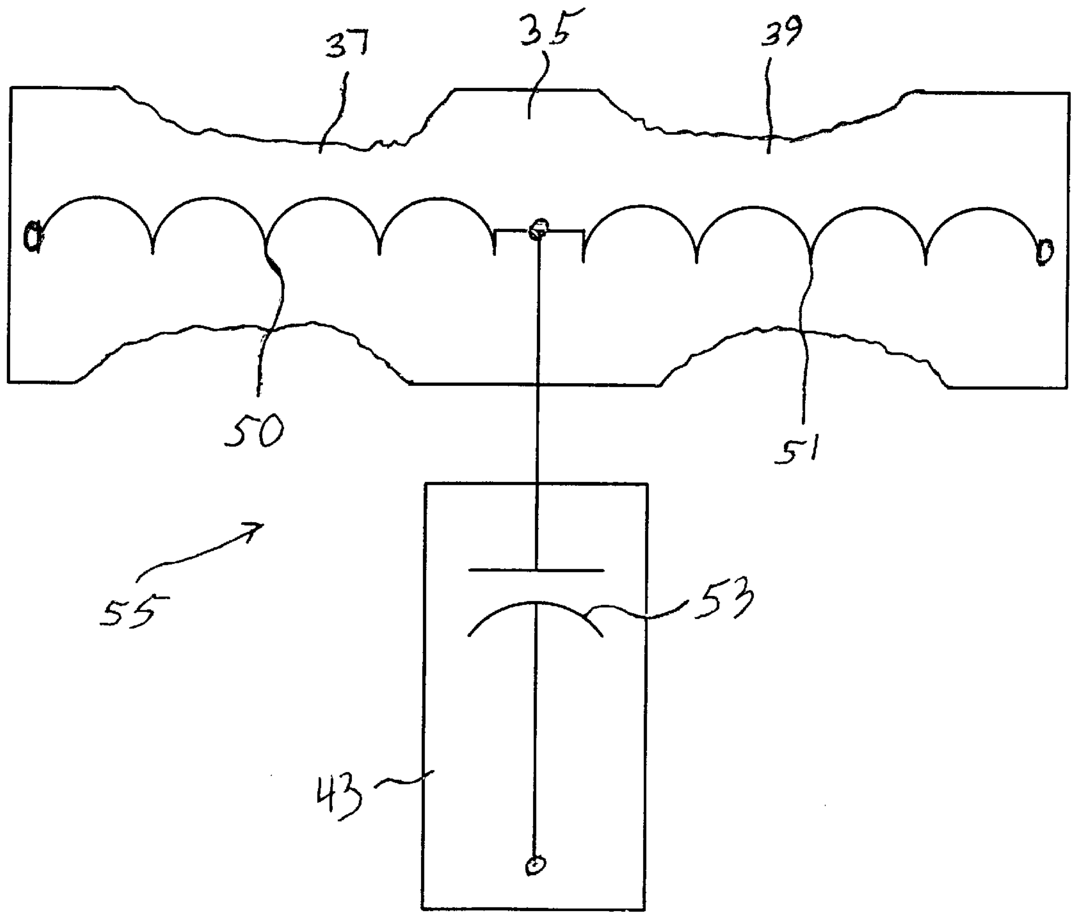
PRIOR ART FIG. 4
FIG. 4 is a schematic diagram of the apparatus of FIG. 3.

The relay 33 adds a shunt capacitance to the transmission line 35, behaving as a transmission line shunt stub. When the reed portion 43 is in an open position, the total length L of the first signal lead 41 and the reed portion 43 forms a relatively long "stub" having a large shunt capacitance which creates a mismatch in the impedance along the transmission line. The shunt capacitance can be substantially canceled by adding series inductance to return the transmission line to its characteristic impedance value. The series inductance is created by trimming the transmission line to form narrow sections of transmission line 37, 39 (FIG. 3). Referring now to the high level diagram 55 depicted in FIG. 4, the inductance of the trimmed lines 37, 39 is represented by series inductances 50, 51 and the capacitance of the reed portion 43 is represented by a shunt capacitance 53.

The prior art structure and method for characteristic impedance compensation, illustrated in FIG. 3, has several disadvantages. In general, relatively large trimmed line series inductances 37, 39 are required to cancel the relatively large relay shunt capacitance 53. The circuit 55 oscillates at a frequency proportional to:

$$\frac{1}{\sqrt{L\cdot C}}$$

As seen from this equation, relatively large inductances and capacitances lead to relatively low frequency oscillation in the circuit 55, setting an upper limit on the frequency of the signals sent down the transmission line 35. In addition, trimming the transmission line increases dielectric losses and ohmic conductor losses due to the "skin effect".

The design of FIG. 1 matches the impedance of the relay 19 to the impedance of the lengths of transmission line 13, 15 while allowing high frequency operation and low loss. The inductances of the branches 21, 23 of the first signal lead 18 in FIG. 1 are represented as the inductances 27, 29 in FIG. 2. The reed portion 25, electrically connected to the branches 21, 23 in FIG. 1, is shown connected to the inductances 27, 29 in FIG. 2. The capacitance of the reed portion 25 is represented as a capacitance 31 in FIG. 2. The transmission lines 13, 15 of FIGS. 1 and 2 have controlled characteristic impedances of 50 ohms each. The relay 19, is matched to the transmission lines 13, 15 because the series inductances provided by the signal lead inductances 27, 29 substantially cancels the shunt capacitance 31 added by the reed portion 25. Thus, both the input and output impedances, Zin and Zout, looking down the transmission lines 13, 15 toward the relay 19 remain substantially 50 ohms.

Figure 2:
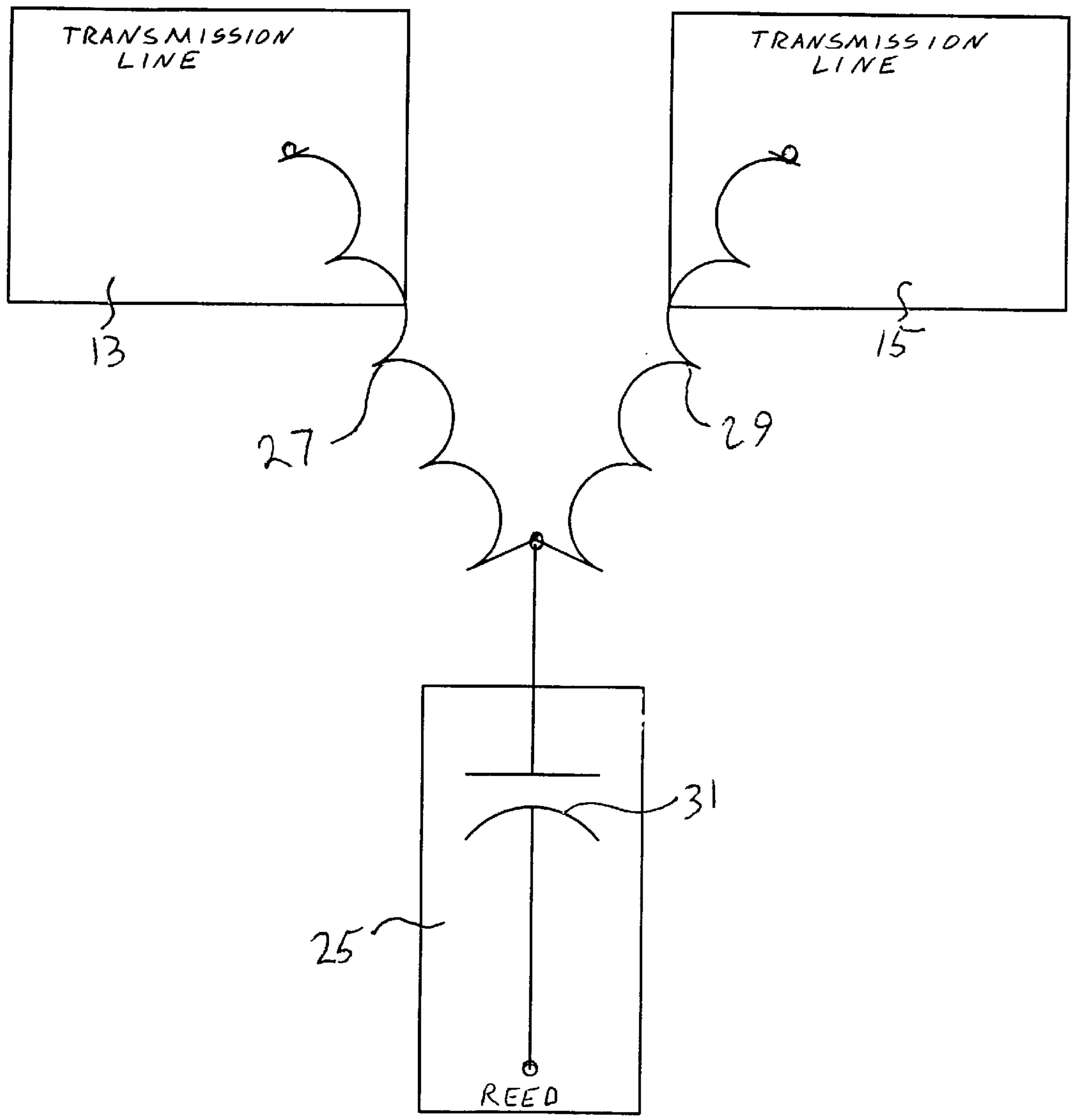
FIG. 2 is a schematic diagram of the apparatus of FIG. 1.

In the structure of FIG. 1, the reed portion 25 acts as a relatively short stub of length 9 creating the shunt capacitance 31 of FIG. 2. In the prior art structure of FIG. 3, however, the much greater combined length L of the signal lead 41 and the reed portion 43 create a much larger shunt capacitance 53. Because the length e of the stub formed by the reed portion 25 alone is shorter than the length L of the stub formed by the signal lead 41 and the reed portion 43, the capacitance 31 is much smaller than the capacitance 53. Thus, the series inductances 27, 29 of the branches 21, 23 can be smaller than the series inductances 50, 51 of the thinned lines 37, 39, and still compensate for the shunt capacitance 31. The signal lead branches 21, 23 of FIG. 1 thus reduce the mismatch between the device and the transmission line by providing series inductance, rather than increasing the mismatch by adding shunt capacitance as does the signal lead 41 of FIG. 3. In this way, the improved apparatus and method for characteristic impedance compensation illustrated in FIG. 1 significantly raises the oscillation frequency of the relay and permits higher frequency operation.

The transmission lines 13, 15 of FIG. 1 can also be trimmed to add additional inductance if the branches 21, 23 do not provide sufficient series inductance to compensate for the shunt capacitance. However, the trimming required, if any, is far less than that required in the arrangement of FIG. 3 because less compensating series inductance is needed.

In creating the arrangement of FIG. 1, the relay 19 can be newly fabricated or can be created by modifying a relay of the type illustrated in FIG. 3 at 33. In one form, the relay 33 is a Model 9800 Surface Mount Reed Relay manufactured by Coto Technology of Providence R.I., as illustrated in FIG. 3, and the relay 19 is a modified version of the Model 9800, as illustrated in FIG. 1. In modifying the relay 33, a ground lead 57 may be cut away from a ground lead 59 and attached to the signal lead 41 so that the ground lead 57 and the original signal lead 41 become the two branches 21, 23 of the signal lead 18 of the relay 19. The ground lead 57 is attached to the signal lead 41 at a position adjacent an operative portion of the relay. As illustrated in FIG. 1, the operative portion includes the reed portion 25 of the relay 19. Alternatively, other leads can be attached to a signal lead so that a two branch signal lead is formed for attaching to the signal channel. The gap 17 between the transmission line lengths 13, 15 can be created, for example, during etching of the circuit board, or can be created by cutting a gap in a transmission line. The gap 17 should electrically separate the two lengths of the transmission line 13, 15 so that signals do not pass directly between the lengths of transmission line 13, 15. Rather, signals 14 pass through the signal lead 18 to travel between the lengths of transmission line 13, 15 to a destination such as a device under test ("DUT"). The branches 21, 23 of the signal lead 18 are electrically connected to the sections of transmission line 13, 15 and are also electrically connected to the reed portion 25 The electrical connections can be formed by well known methods such as bonding, welding or soldering. Alternatively, the electrical connections can be formed by passing the signals through intermediate connections or devices so long as the branches 21, 23 are connected electrically in series within the signal channel.

Figure 5:
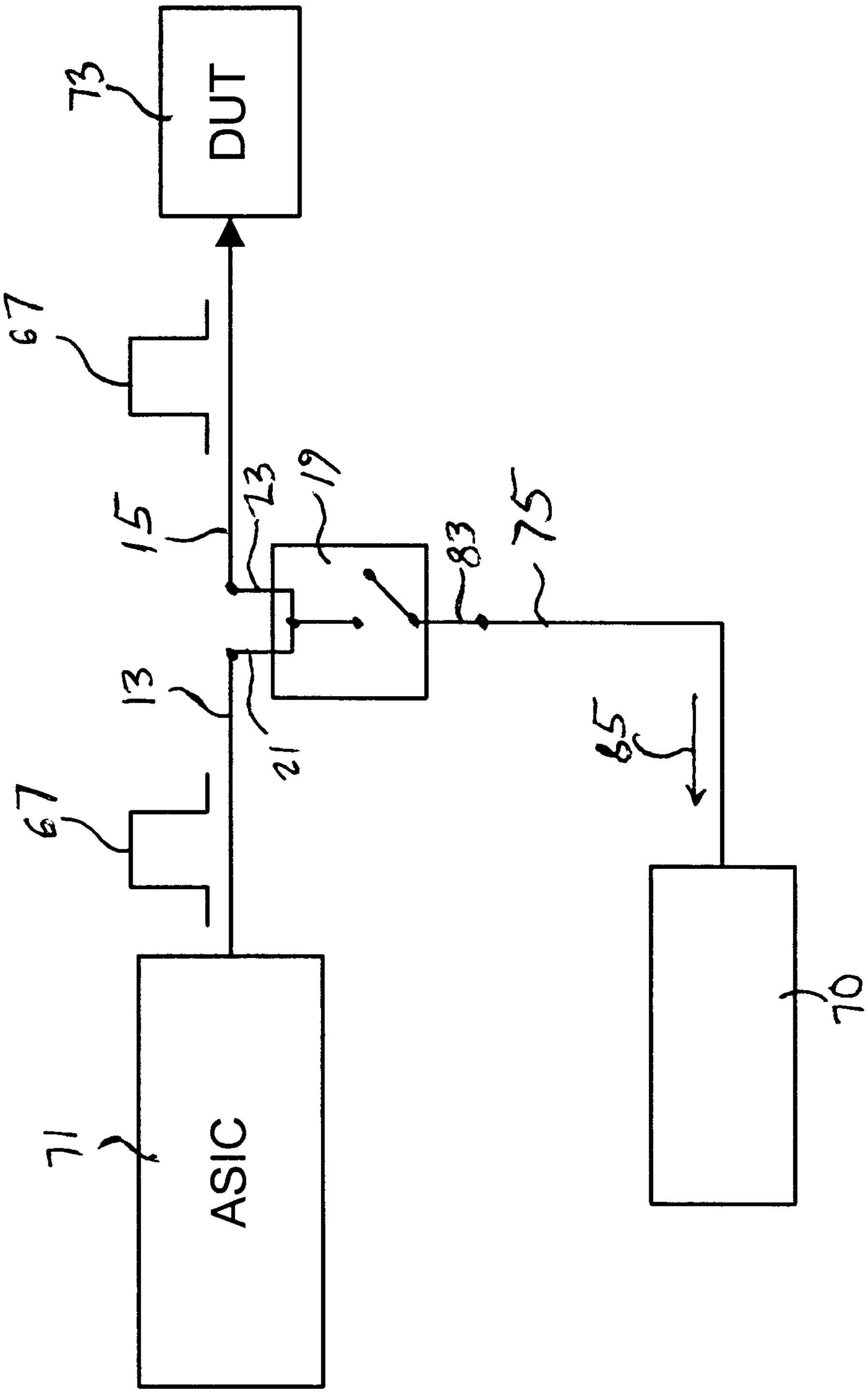
FIG. 5 is a block diagram of a semiconductor device testing system utilizing the apparatus of the present invention for shunt capacitance compensation in a signal channel.

FIG. 5 shows a simplified diagram of the arrangement for shunt capacitance compensation illustrated in FIG. 1 configured for testing a device under test ("DUT") 73. Digital test signals 67 are supplied by an application specific integrated circuit ("ASIC") 71. The ASIC 71 can include drivers for applying signals to the DUT and comparators for capturing DUT output signals. An alternate calibration path 75 leading to a parametric measurement unit ("PMU") 70 is switched in by activating the relay 19. The digital test signals 67 travel along the length of transmission line 13, enter the relay 19 through the branch 21, exit the relay through the branch 23, and then travel alone the length of transmission line 15 to the DUT 73. When coil leads 79, 81 of FIG. 1 are energized to move the reed portion 25 into a closed contact position with a reed portion 26, calibration signals 85 exit a second signal lead 83 to the alternate calibration path 75 and enter the PMU 70. Rather than leading to the PMU 70, the alternate calibration path 75 can lead to other devices and can provide an alternative signal path for signals other than calibration signals 85. For example, the alternative signal path 75 can be used to carry alternating current ("AC") calibration signals. The DUT 73 can be, for example, a DRAM utilizing RAMBUS technology to operate at approximately 800 MHz. In order to test the device at such high frequencies it is necessary to avoid low frequency resonances and to maintain a matched transmission path so that the waveform aberrations are minimized for accurate detection.

Figure 6:
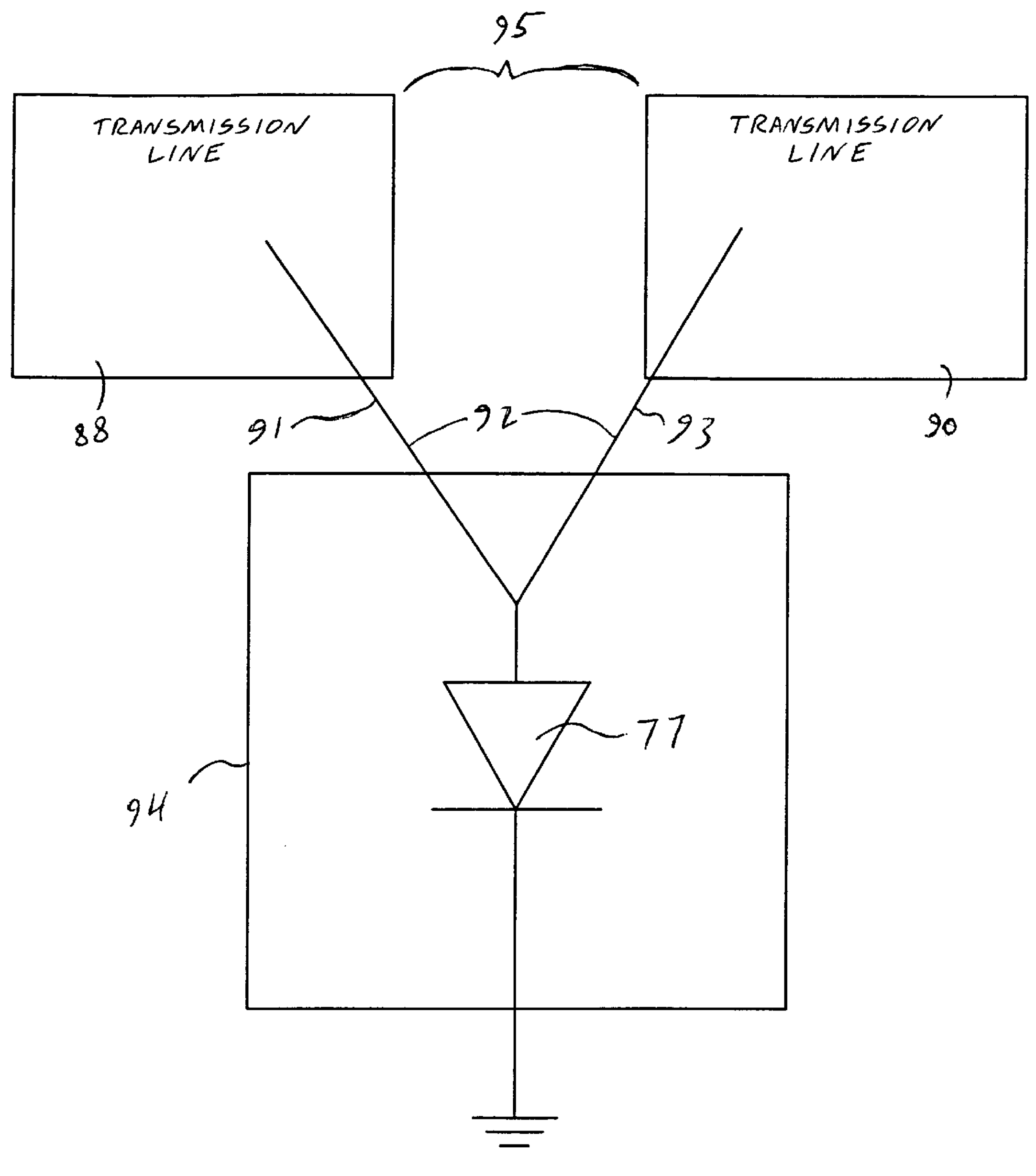
FIG. 6 is a diagrammatic view of an apparatus constructed according to the invention for characteristic impedance compensation, in which the modified device is a diode.
Figure 7:
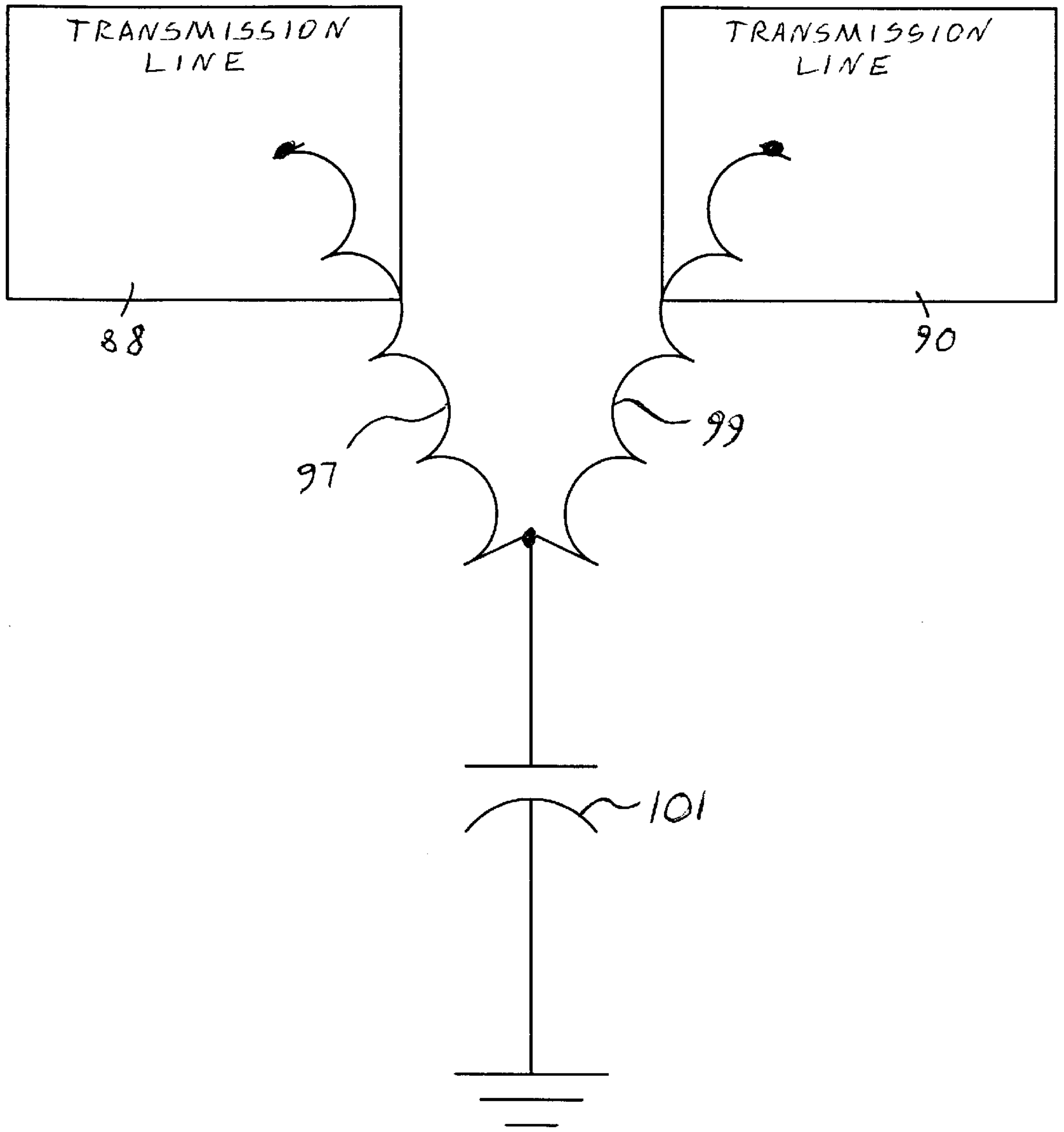
FIG. 7 schematically illustrates the high level diagram of the structure of FIG. 6.

FIGS. 6 and 7 illustrate how the apparatus and method for characteristic impedance compensation in a signal channel of the present invention can be used with electrical or electronic devices other than relays. A clamping diode, for example, can be attached to a transmission line in a like manner to the way the relay is attached to the transmission line of FIG. 1. The combined clamping diode and the lead connecting the diode to the transmission line add a relatively large shunt capacitance to the transmission line, degrading its typical 50 ohm controlled characteristic impedance.

FIG. 6 shows a clamping diode 77 modified according to the present invention so that the first signal lead 92 has two branches 91, 93. The branches 91, 93 are attached together at a position adjacent an operative portion of the diode 77. For example, the branches can be attached together at a position inside the diode packaging 94. The branches 91, 93 are connected across a gap 95 between lengths of transmission line 88, 90, so that the branches 91, 93 provide compensating series inductance rather than additional shunt capacitance, thus raising the oscillation frequency of the effective LC circuit and allowing higher frequency operation.

FIG. 7 shows the high level diagram of the structure of FIG. 6, with an inductance 97 representing the inductance of the branch 91, an inductance 99 representing the inductance of the branch 93, and a capacitance 101 representing the relatively small capacitance of the diode 77. Thus, the branches together have an inductance which substantially cancels a capacitance introduced by the device to substantially maintain the characteristic impedance of the signal channel.

Although the present invention has been described with respect to circuits utilizing relays and diodes, it will be understood that other devices can be connected into high speed circuits in a similar manner to provide series inductance to compensate for the shunt capacitance of the device. In addition, the described method of connecting the device leads in series within a signal channel is intended to encompass a wide variety of connection schemes, regardless of whether the connection is made along the length of the channel or at one end of it.

While the above description contains many specific features of the invention, these should not be construed as limitations on the scope of the invention, but rather as an example of one preferred embodiment thereof. Many other variations are possible. Accordingly, the scope of the invention should be determined not by the embodiments illustrated, but by the appended claims and their legal equivalents.

What is claimed is:

1. An apparatus for shunt capacitance compensation in a signal channel transmission line to which an electrical device is connected, comprising:

a signal channel transmission line for transmitting signals to a destination, the signal channel transmission line including first and second lengths of transmission line separated by a gap;

a device having a first signal lead forming first and second branches connected together at a location adjacent an operative portion of the device so that the first signal lead is electrically connected to the operative portion of the device;

the first branch is connected to the first length of transmission line and the second branch is connected to the second length of transmission line to electrically couple the branches in series within the signal channel; and wherein the branches together have a combined series inductance which substantially cancels the shunt capacitance introduced by the device.

2. The apparatus of claim 1, wherein:

the first and second branches are connected together at a location within the device.

3. The apparatus of claim 1, wherein:

the device is a relay.

4. The apparatus of claim 3, wherein:

the relay is a reed relay and a reed portion is the operative portion of the device.

5. The apparatus of claim 4, wherein:

the reed relay is actuable between a normally open condition and a closed condition.

6. The apparatus of claim 5, wherein:

the relay initially has a first ground lead, a second ground lead and a second signal lead; and the first branch of the first signal lead is formed by disconnecting the first ground lead from the second ground lead and reattaching it to the first signal lead at a location adjacent the operative portion of the relay.

7. The apparatus of claim 6, wherein:

in the normally open condition of the relay, a digital signal is able to pass from the first length of the transmission line, through the first branch of the first signal lead, to the second branch of the first signal lead, and then to the second length of the transmission line; and when the relay is actuated to the closed condition, an alternative path is formed between the first and second signal leads through which signals can pass.

8. The apparatus of claim 7, wherein:

the second length of transmission line is electrically connected to the destination; and the destination is a device under test.

9. The apparatus of claim 7, wherein:

the second signal lead is electrically connected to a parametric measurement unit.

10. The apparatus of claim 1, wherein:

the device is a clamping diode.

11. A method for characteristic impedance compensation in a signal channel to which an electrical device is connected comprising the steps of:

providing a signal channel for passing signals to a destination;

providing an electrical device having a first signal lead having first and second branches electrically connected together at a location adjacent an operative portion of the device; and coupling said first and second branches of the first signal lead in series within the signal channel such that the branches have a combined inductance which substantially cancels a capacitance introduced by the device.

12. The method of claim 11, wherein:

the signal channel includes first and second lengths of transmission line separated by a gap; and the coupling step includes connecting the first branch to the first length of transmission line and the second branch to the second length of transmission line to electrically couple the branches in series within the signal channel.

13. The method of claim 11, wherein the step of providing the electrical device further comprises:

connecting the first and second branches together at a location within the device.

14. The method of claim 12, wherein:

the device is a reed relay having an operative reed portion, the reed relay is normally in an open condition; and the method further includes the step of actuating the relay to switch to a closed condition.

15. The method of claim 14, wherein:

the relay initially has a first ground lead, a second ground lead and a second signal lead; and the first branch of the signal lead is formed by disconnecting the first ground lead from the second ground lead and reattaching it to the first signal lead at a location adjacent the operative portion of the relay.

16. The method of claim 15, wherein:

in the normally open condition of the relay, a digital signal is passed from the first length of the transmission line, through the first branch of the first signal lead, to the second branch of the first signal lead, and then to the second length of the transmission line; and when the relay is actuated to the closed condition, an alternative path is provided between the first and second signal leads through which signals can pass.

17. The method of claim 16, further including the step of:

electrically connecting the second length of transmission line to the destination; and the destination is a device under test.

18. The method of claim 17, further including the step of:

electrically connecting the second signal lead to a parametric measurement unit.

19. The method of claim 12, wherein:

the device is a clamping diode.

20. A reduced capacitance relay for use with a signal channel, comprising:

an operative switching portion for switching between open and closed conditions;

first and second signal leads connected to the operative switching portion so that signals can pass between the first and second signal leads when the relay is closed;

the first signal lead forming first and second branches connected together at a location adjacent the operative switching portion of the device such that the branches have a combined inductance which substantially cancels a capacitance introduced by the operative switching portion of the device when the branches are coupled to form a series connection within the signal channel.

21. A method for modifying a relay to produce a reduced capacitance relay comprising the steps of:

electrically disconnecting two ground leads from each other;

reattaching one of the ground leads to a signal lead at a position adjacent an operative switching portion of the device to form first and second branches of the signal lead having a combined inductance which substantially cancels a capacitance introduced by the operative portion of the device.

* * * * *